(12) United States Patent
Jeong et al.

(10) Patent No.: US 9,880,467 B2
(45) Date of Patent: Jan. 30, 2018

(54) PHOTO-CURABLE AND THERMO-CURABLE RESIN COMPOSITION AND DRY FILM SOLDER RESIST

(71) Applicant: LG CHEM, LTD., Seoul (KR)

(72) Inventors: Min Su Jeong, Daejeon (KR); Byung Ju Choi, Daejeon (KR); Woo Jae Jeong, Daejeon (KR); Bo Yun Choi, Daejeon (KR); Kwang Joo Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 11 days.

(21) Appl. No.: 14/419,179

(22) PCT Filed: Jul. 26, 2013

(86) PCT No.: PCT/KR2013/006747
§ 371 (c)(1),
(2) Date: Feb. 2, 2015

(87) PCT Pub. No.: WO2014/021590
PCT Pub. Date: Feb. 6, 2014

(65) Prior Publication Data
US 2015/0205202 A1    Jul. 23, 2015

(30) Foreign Application Priority Data

Aug. 1, 2012 (KR) .......................... 10-2012-0084462
Jul. 26, 2013 (KR) .......................... 10-2013-0088425

(51) Int. Cl.
*G03F 7/037*     (2006.01)
*G03F 7/038*     (2006.01)
(Continued)

(52) U.S. Cl.
CPC ........... *G03F 7/037* (2013.01); *C09D 133/14* (2013.01); *G03F 7/004* (2013.01); *G03F 7/027* (2013.01);
(Continued)

(58) Field of Classification Search
None
See application file for complete search history.

(56) References Cited

U.S. PATENT DOCUMENTS 8,334,092 B2 * 12/2012 Choi .................. C08G 59/4021
430/280.1
8,349,538 B2 * 1/2013 Jeong ..................... G03F 7/038
430/270.1
(Continued)

FOREIGN PATENT DOCUMENTS

JP        11-282155      * 10/1999
JP     2003-005365 A      1/2003
(Continued)

OTHER PUBLICATIONS

JPO English abstract for JP11-282155 (1999).*
(Continued)

*Primary Examiner* — Sin Lee
(74) *Attorney, Agent, or Firm* — Rothwell, Figg, Ernst & Manbeck, P.C.

(57) ABSTRACT

The present invention relates to a photo-curable and thermo-curable resin composition which can form a DFSR having micro unevenness on the surface without a separate treatment such as plasma treatment and the like and a DFSR. The photo-curable and thermo-curable resin composition includes an acid-modified oligomer having a carboxyl group (—COOH) and a photo-curable unsaturated functional group; a polyimide-based resin; a photo-polymerizable monomer having two or more photo-curable unsaturated
(Continued)

functional groups; a thermo-curable binder having a thermo-curable functional group; and a photoinitiator.

16 Claims, 6 Drawing Sheets (51) Int. Cl.
  *G03F 7/031*  (2006.01)
  *G03F 7/027*  (2006.01)
  *G03F 7/029*  (2006.01)
  *G03F 7/028*  (2006.01)
  *G03F 7/032*  (2006.01)
  *G03F 7/11*  (2006.01)
  *G03F 7/115*  (2006.01)
  *G03F 7/004*  (2006.01)
  *H01L 21/027*  (2006.01)
  *C09D 133/14*  (2006.01)

(52) U.S. Cl.
  CPC .............. *G03F 7/028* (2013.01); *G03F 7/029* (2013.01); *G03F 7/031* (2013.01); *G03F 7/032* (2013.01); *G03F 7/038* (2013.01); *G03F 7/11* (2013.01); *G03F 7/115* (2013.01); *H01L 21/027* (2013.01); *H01L 21/0271* (2013.01)

(56) References Cited

U.S. PATENT DOCUMENTS

| | | | | |
|---|---|---|---|---|
| 2007/0122742 | A1* | 5/2007 | Kato | G03F 7/038 |
| | | | | 430/270.1 |
| 2008/0268374 | A1* | 10/2008 | Tashiro | G03F 7/0045 |
| | | | | 430/280.1 |
| 2010/0113640 | A1* | 5/2010 | Lee | G03F 7/027 |
| | | | | 522/76 |
| 2011/0200939 | A1* | 8/2011 | Lee | C08G 73/10 |
| | | | | 430/280.1 |
| 2011/0269866 | A1* | 11/2011 | Jeong | G03F 7/038 |
| | | | | 522/38 |

FOREIGN PATENT DOCUMENTS

| | | |
|---|---|---|
| JP | 2004-325616 A | 11/2004 |
| JP | 2004-325980 A | 11/2004 |
| JP | 2006-220886 A | 8/2006 |
| JP | 2008-265069 A | 11/2008 |
| JP | 2009-069664 A | 4/2009 |
| JP | 2009-230076 A | 10/2009 |
| JP | 2012-108235 A | 6/2012 |
| JP | 2012-141605 A | 7/2012 |
| KR | 10-2005-0084003 A | 8/2005 |
| KR | 10-2006-0124859 A | 12/2006 |
| KR | 10-2007-0039151 A | 4/2007 |
| KR | 10-0748219 B1 | 8/2007 |
| KR | 10-2007-0108919 A | 11/2007 |
| KR | 10-2008-0100823 A | 11/2008 |
| KR | 10-0902339 B1 | 6/2009 |
| KR | 10-1010036 B1 | 1/2011 |
| KR | 10-2011-0106237 A | 9/2011 |
| KR | 10-2012-0060938 A | 6/2012 |
| TW | 201116554 A | 5/2011 |
| TW | 201142499 A | 12/2011 |
| WO | 2010/074197 A1 | 7/2010 |
| WO | 2012/176694 A1 | 12/2012 |

OTHER PUBLICATIONS

Machine-assisted English translation of JP11-282155 as provided by JPO (1999).*
Partial English translation of JP2003-5365, as provided by USPTO (2003).*
Machine-assisted English translation of JP2003-5365, as provided by JPO (2003).*
International Search Report issued in International Application No. PCT/KR2013/006747 dated Oct. 16, 2013, 2 pages.

* cited by examiner

[Fig. 1]

Possible to form unevenness after developing and possible to skip plasma treatment

PHOTO-CURABLE AND THERMO-CURABLE RESIN COMPOSITION AND DRY FILM SOLDER RESIST

CROSS REFERENCE TO RELATED APPLICATIONS

This application is a 35 U.S.C. §371 National Phase Entry Application from PCT/KR2013/006747, filed on Jul. 26, 2013, and designating the United States, which claims priority under 35 U.S.C. §119 to Korean Patent Application No. 10-2012-0084462, filed on Aug. 1, 2012, and to Korean Patent Application No. 10-2013-0088425, filed on Jul. 26, 2013, which are incorporated herein by reference in their entireties.

TECHNICAL FIELD

The present invention relates to a photo-curable and thermo-curable resin composition, and a dry film solder resist (DFSR). More specifically, the present invention relates to a photo-curable and thermo-curable resin composition which can form a DFSR having micro unevenness on the surface without a separate treatment such as plasma treatment and the like, and a DFSR.

BACKGROUND

Following to the trend of miniaturization and weight lightening of various electronic devices, photosensitive solder resists which can form micro opening patterns are being used to printed circuit boards, semiconductor package substrates, flexible circuit boards, and the like.

The solder resist, generally, requires developing property, high resolution, insulating property, solder resistance, gold plating resistance, and the like. And, when the solder resist is applied to the semiconductor package substrate and the like, micro unevenness is formed on the surface of the film type solder resist with necessity for securing good adhesive strength with follow-up materials during the process.

Heretofore, a separate surface treatment process such as plasma treatment was applied for forming such micro unevenness on the surface after the film type solder resist, for example DFSR, is formed through the processes of photo-curing, thermo-curing, and so on. However, there was a disadvantage of that total process became complicated and uneconomical because of the additional separate process such as plasma treatment.

CONTENTS OF THE INVENTION

Objects of the Invention

It is an aspect of the present invention to provide a photo-curable and thermo-curable resin composition which can form a DFSR having micro unevenness on the surface without a separate treatment such as plasma treatment and the like.

It is another aspect of the present invention to provide a dry film solder resist (DFSR) having micro unevenness formed on the surface without a separate treatment process such as plasma treatment and having good adhesive strength adhesive strength with other materials.

Furthermore, the present invention relates to a printed circuit including the DFSR.

Means For Achieving the Object

The present invention provides a photo-curable and thermo-curable resin composition including an acid-modified oligomer having carboxyl group (—COOH) and photo-curable unsaturated functional group; a polyimide-based resin; a photo-polymerizable monomer having two or more photo-curable unsaturated functional groups; a thermo-curable binder having thermo-curable functional group; and a photoinitiator.

The present invention also provides a dry film solder resist including a cured product of an acid-modified oligomer having carboxyl group (—COOH) and photo-curable unsaturated functional group; a photo-polymerizable monomer having two or more photo-curable unsaturated functional groups; and a thermo-curable binder having thermo-curable functional group, of which micro unevenness having the average roughness (Rz) of 2 to 20 μm is formed on the surface.

Hereinafter, the photo-curable and thermo-curable resin composition according to the embodiment of the present invention and the DFSR are explained in more detail.

According to one embodiment of the present invention, a photo-curable and thermo-curable resin composition including an acid-modified oligomer having carboxyl group (—COOH) and photo-curable unsaturated functional group; a polyimide-based resin; a photo-polymerizable monomer having two or more photo-curable unsaturated functional groups; a thermo-curable binder having thermo-curable functional group; and a photoinitiator is provided.

In the resin composition, a polyimide-based resin is included in company with a certain acid-modified oligomer, a photo-polymerizable monomer, a photoinitiator, and a thermo-curable binder.

Such resin composition of one embodiment can be used for forming a DFSR through the following processes. At first, the resin composition is coated on a substrate and the resin composition of the part where the DFSR will be formed is selectively exposed to light. By carrying out such light exposure, the unsaturated functional group included in the acid-modified oligomer and the unsaturated functional group included in the photo-polymerizable monomer can be photo-cured and form a cross-linked bond, and consequently a cross-linked structure can be formed at the light exposed part by the photo-curing process.

After then, a developing process is carried out with an alkali developer so that the resin composition of the light exposed part where the cross-linked structure is formed remains on the substrate as it is and the resin composition of the non-exposed part can be dissolved in the developer and eliminated.

Subsequently, a thermo-curing process is carried out by heat-treating the resin composition remained on the substrate so that the carboxyl group included in the acid-modified oligomer can react with the thermo-curable functional group of the thermo-curable binder and can form a cross-linked bond, and consequently a cross-linked structure is formed by the thermo-curing and the DFSR can be formed on the desired part of the substrate.

However, when the DFSR formed like this is applied to a semiconductor package substrate and the like, it is necessary to form micro unevenness on the DFSR for securing good adhesive strength with follow-up materials during the process. By forming such micro unevenness on the DFSR surface, the contacting surface area between the DFSR and the follow-up materials applied on the DFSR can increase, and consequently good adhesive strength can be secured.

Heretofore, however, a separate surface treatment process such as plasma treatment process and the like has been applied thereto for forming such micro unevenness, after forming the DFSR through photo-curing and thermo-curing processes disclosed above. But there was a disadvantage of that total process became complicated because of the addition of the plasma treatment process and the like.

In comparison, since the resin composition of one embodiment can resolve such disadvantage because it includes the polyimide-based resin. Namely, the polyimide-based resin does not show photo-curable property, is poorly miscible with the acid-modified oligomer, and can be dissolved in the developer. Owing to such characteristics of the polyimide-based resin, at the non-exposed part where the photo-curing is not happened, when the resin composition is developed after the light exposure, the resin composition including the polyimide-based resin can be substantially dissolved and eliminated altogether by the developing process. In comparison, at the light exposed part, the polyimide-based resin can cause a minute phase separation from the other components of the resin composition because it is immiscible with the acid-modified oligomer and the like, and consequently it can exist practically discretely from the other components such as the acid-modified oligomer cross-linked by the photo-curing. The polyimide-based resin can be selectively eliminated by dissolving the same in the developer and only the other components such as the cross-linked acid-modified oligomer can remain at the light exposed part. Therefore, owing to the selective elimination of the polyimide-based resin, the micro unevenness can be formed on the light exposed part (refer to FIG. 1).

Therefore, by forming the DFSR with the resin composition of one embodiment, micro unevenness can be formed on the surface the DFSR, even if the separate plasma treatment process is not applied thereto. Particularly, since micro unevenness is formed on the surface of the DFSR even if merely the developing process for forming the DFSR is carried out, the forming process of the DFSR can be simplified and the DFSR having good adhesive strength with the follow-up materials can be prepared.

Hereinafter, each component of the resin composition according to one embodiment is explained in more detail.

Acid-Modified Oligomer

Said resin composition of one embodiment includes the acid-modified oligomer having carboxyl group (—COON) and photo-curable unsaturated functional group. Such acid-modified oligomer can be cross-linked with the other components of the resin composition, namely, the photo-polymerizable monomer and/or the thermo-curable binder, by the photo-curing, and makes it possible to prepare the DFSR. And, the resin composition has alkali-developable property because of including carboxyl group.

As the acid-modified oligomer, any oligomer having carboxyl group and a photo-curable functional group, for example a curable functional group having an acrylate group or unsaturated double bond, in the molecule, which is known to be usable to a photo-curable resin composition, can be used unlimitedly. For example, the main chain of the acid-modified oligomer may be a novolak epoxy or polyurethane, and the acid-modified oligomer including carboxyl group and acrylate group and the like introduced to the main chain may be used. Preferably, the photo-curable functional group may be an acrylate group. At this time, the acid-modified oligomer may be obtained by co-polymerizing a polymerizable monomer having carboxyl group and a monomer including an acrylate-based compound in a form of oligomer.

More specifically, concrete examples of the acid-modified oligomer usable to the resin composition are as follows.

(1) A resin including carboxyl group obtained by copolymerizing an unsaturated carboxylic acid (a) such as (meth)acrylic acid and the like and a compound (b) having unsaturated double bond such as styrene, a-methyl styrene, low alkyl(meth)acrylate, isobutylene, and the like;

(2) A photo-sensitive resin including carboxyl group obtained by reacting a compound having ethylenically unsaturated group such as vinyl group, allyl group, (meth)acryloyl group, and the like and reactive group such as epoxy group, acyl chloride, and the like, for example glycidyl (meth)acrylate, to the part of the copolymer of the unsaturated carboxylic acid (a) and the compound (b) having unsaturated double bond, followed by adding ethylenically unsaturated group thereto as a pendant;

(3) A photo-sensitive resin including carboxyl group obtained by reacting the unsaturated carboxylic acid (a) to a copolymer of a compound (c) having epoxy group and unsaturated double bond such as glycidyl (meth)acrylate, α-methylglycidyl(meth)acrylate, and the like and the compound (b) having unsaturated double bond, followed by reacting a saturated or unsaturated polybasic acid anhydride (d) such as phthalic anhydride, tetrahydrophthalic anhydride, hexahydrophthalic anhydride, and the like to secondary hydroxyl group formed therefrom;

(4) A photo-sensitive resin including carboxyl group obtained by reacting a compound (f) having one hydroxyl group and one or more ethylenically unsaturated double bonds such as hydroxyalkyl(meth)acylate and the like to a copolymer of an acid anhydride (e) having unsaturated double bond such as maleic anhydride, itaconic anhydride, and the like and the compound (b) having unsaturated double bond;

(5) A photo-sensitive compound including carboxyl group obtained by esterifying (totally or partially esterifying, preferably totally esterifying) epoxy group of multifunctional epoxy resin (g) having two or more epoxy groups in the molecule as disclosed below or multifunctional epoxy resin of which hydroxyl group is additionally epoxyfied with epichlorohydrin, and carboxyl group of unsaturated monocarboxylic acid (h) such as (meth)acrylic acid, and additionally reacting a saturated or unsaturated polybasic acid anhydride (d) to hydroxyl group formed therefrom;

(6) A resin including carboxyl group obtained by reacting an organic acid (i) which includes any one carboxyl group among a $C_2$-$C_{17}$ alkylcarboxylic acid, an alkylcarboxylic acid containing aromatic group, and the like, and does not include ethylenically unsaturated group to epoxy group of a copolymer of the compound (b) having unsaturated double bond and glycidyl (meth)acrylate;

(7) A urethane resin including carboxyl group obtained by polyaddition reaction of a diisocyanate (j) such as an aliphatic diisocyanate, a graft aliphatic diisocyanate, an alicyclic diisocyanate, an aromatic diisocyanate, and the like, a dialcohol compound (k) including carboxyl group such as dimethylol propionic acid, dimethylolbutanoic acid, and the like, and a diol compound (m) such as a polycarbonate-based polyol, a polyether-based polyol, a polyester-based polyol, a polyolefin-based polyol, an acryl-based polyol, a bisphenol A-based alkyleneoxide adduct diol, and a compound having phenolic hydroxyl group and alcoholic hydroxyl group;

(8) A photosensitive urethane resin including carboxyl group obtained by polyaddition reaction of the diisocyanate (j), a (meth)acrylate of bifunctional epoxy resin such as a bisphenol A-type epoxy resin, a hydrogenated bisphenol A-type epoxy resin, a brominated bisphenol A-type epoxy resin, a bisphenol F-type epoxy resin, a bisphenol S-type epoxy resin, a bixylenol-type epoxy resin, a biphenol-type epoxy resin, or a partial acid anhydride thereof (n), the dialcohol compound (k) including carboxyl group, and the diol compound (m);

(9) A urethane resin including carboxyl group of which an unsaturated double bond is introduced to the end by adding the compound (f) having one hydroxyl group and one or more ethylenically unsaturated double bonds such as hydroxyalkyl(meth)acylate during the synthesis of the resin (7) or (8);

(10) A urethane resin including carboxyl group of which the end is (meth)acrylated by adding a compound having one isocyanate group and one or more (meth)acryloyl group in the molecule such as an equimolar reactant of isophorone diisocyanate and pentaerythritol triacrylate during the synthesis of the resin (7) or (8), and (meth)acrylating the end groups;

(11) A photo-sensitive resin including carboxyl group obtained by reacting the saturated or unsaturated polybasic acid anhydride (d) to primary hydroxyl group of a modified oxetane compound obtained by reacting the unsaturated monocarboxylic acid (h) to a multifunctional oxetane compound having two or more oxetane ring in the molecule as disclosed below;

(12) A photo-sensitive resin including carboxyl group obtained by introducing an unsaturated double bond to a reaction product of bisepoxy compound and bisphenols, followed by reacting the saturated or unsaturated polybasic acid anhydride (d) thereto;

(13) A photo-sensitive resin including carboxyl group obtained by reacting the saturated or unsaturated polybasic acid anhydride (d) to a reaction product obtained by reacting the unsaturated monocarboxylic acid (h) to a reaction product of a novolak-type phenol resin, and an alkyleneoxide such as ethyleneoxide, propyleneoxide, butyleneoxide, trimethyleneoxide, tetrahydrofuran, tetrahydropyran and/or a cyclic carbonate such as ethylenecarbonate, propylenecarbonate, butylenecarbonate, and 2,3-carbonatepropylmethacrylate;

Among the components disclosed above, when the compound including isocyanate group which is used for synthesizing the resins of (7) to (10) is a diisocyanate not including benzene ring, and when the multifunctional or bifunctional epoxy resin which is used for synthesizing the resins of (5) to (8) is a linear compound having a bisphenol A skeleton, a bisphenol F skeleton, a biphenyl skeleton, or a bixylenol skeleton, or a hydrogenated product thereof, the acid-modified oligomer which can be used preferably in the aspect of the flexibility of DFSR can be obtained. Furthermore, in another aspect, since the modified resin products of (7) to (10) include urethane bond, they are preferable for flexibility.

And, as the commercially obtainable acid-modified oligomers, for example, ZAR-2000, ZFR-1031, ZFR-1121, ZFR-1122, and so on produced by Nipponkayaku Co., Ltd. may be used.

Meanwhile, the acid-modified oligomer may be included in the amount of 15 to 75 weight %, about 20 to 50 weight %, or about 25 to 45 weight % based on the total weight of the resin composition of one embodiment. If the content of the acid-modified oligomer is too low, the developing property of the resin composition gets worse and the strength of DFSR may fall. On the contrary, if the content of the acid-modified oligomer is too high, the resin composition may be excessively developed and the uniformity of coating may fall.

And, the acid value of the acid-modified oligomer may be about 40 to 120 mgKOH/g, about 50 to 110 mgKOH/g, or 60 to 90 mgKOH/g. If the acid value is too low, the alkali-developable property may fall, and if it is too high, on the contrary, it may be difficult to form a normal pattern of DFSR because even the photo-cured part, for example the light exposed part, may be dissolved.

Photo-Polymerizable Monomer

Meanwhile, the resin composition of one embodiment includes a photo-polymerizable monomer. Such photo-polymerizable monomer, for example, may be a compound having two or more photo-curable unsaturated functional groups such as multifunctional vinyl group and the like, and it may form a cross-inked bond with the unsaturated functional group of the acid-modified oligomer and can form a cross-linked structure by the photo-curing when it is exposed to light. Therefore, the resin composition of the light exposed part corresponding to the part where the DFSR will be formed is not developed by alkali and can remain on the substrate.

The photo-polymerizable monomer which is a liquid phase in room temperature may be used, and accordingly, it can take a role of adjusting the viscosity of the resin composition of one embodiment to suit the coating method or improving the alkali-developable property of the non-exposed part together.

As the photo-polymerizable monomer, a (meth)acrylate-based compound having two or more, three or more, or three to six photo-curable unsaturated functional groups in the molecule may be used. For example, one or more compounds selected from the group consisting of photosensitive (meth)acrylate-based compounds such as a multifunctional acrylate-based compound having hydroxyl group such as pentaerythritol triacrylate, dipentaerythritol pentaacrylate, and the like; a water-soluble multifunctional acrylate-based compound such as polyethyleneglycol diacrylate, polypropyleneglycol diacrylate, and the like; a multifunctional polyesteracrylate-based compound of a polyhydric alcohol such as trimethylolpropane triacrylate, pentaerythritol tetraacrylate, dipentaerythritol hexaacrylate, and the like; an acrylate-based compound of an ethyleneoxide adduct and/or a propyleneoxide adduct of multifunctional alcohol such as trimethylol propane, hydrogenated bisphenol A, and the like or polyphenol such as bisphenol A, biphenol, and the like; a multifunctional or monofunctional polyurethaneacrylate-based compound which is an isocyanate adduct of a multifunctional acrylate-based compound having hydroxyl group; an epoxyacrylate-based compound which is a (meth)acrylic acid adduct of bisphenol A diglycidylether, hydrogenated bisphenol A diglycidylether, or phenol novolak epoxy resin; a caprolactone-modified acrylate-based compound; such as caprolactone-modified ditrimethylolpropane tetraacrylate, acrylate of ϵ-caprolactone-modified dipentaerythritol, caprolactone-modified hydroxyl pivalic acid neopentylglycolester diacrylate, and the like; and (meth)acrylate-based compounds corresponding to above acrylate-based compounds may be used, and they may be used solely or by mixing two or more of them.

Among them, a multifunctional (meth)acrylate-based compound having two or more, three or more, or three to six (meth)acryloyl groups in a molecule may be used as the photo-polymerizable monomer. Specifically, pentaerythritol triacrylate, trimethylolpropane triacrylate, dipentaerythritol hexaacrylate, or caprolactone-modified ditrimethylolpropane tetraacrylate may be used preferably. For example, as a commercially obtainable photo-polymerizable monomer, DPEA-12 and the like of KAYARAD may be used.

The content of the photo-polymerizable monomer may be about 5 to 30 weight %, or about 7 to 20 weight %, or about 7 to 15 weight % based on the total weight of the resin composition. If the content of the photo-polymerizable monomer is too low, the photo-curing may be insufficient, and if the content is too high, the drying property of DFSR gets worse and the physical property may fall.

Polyimide-Based Resin

Meanwhile, the resin composition of one embodiment includes a polyimide-based resin. Such polyimide-based resin does not show photo-curable property, is not miscible or reacted with the acid-modified oligomer and the photo-polymerizable monomer, and can be dissolved in the developer. Owing to such characteristics of the polyimide-based resin, only the polyimide-based resin not having photo-curable property can be selectively dissolved in the developer and eliminated from the light exposed part where the photo-curing is progressed, and only the remanent acid-modified oligomer forming a cross-linked structure by the photo-curing can residue, when the resin composition of one embodiment is exposed to light and the developing process is applied thereto. It is because the polyimide-based resin shows immiscibility and non-reactivity to the acid-modified oligomer and causes a minute phase separation after the photo-curing. Therefore, only the polyimide-based resin can be selectively eliminated from the light exposed part and the micro unevenness can be formed on the surface of the DFSR.

Namely, owing to the action of such polyimide-based resin, the DFSR of which micro unevenness is formed on the surface can be obtained without adding a separate plasma treatment process by preparing the DFSR from the resin composition of one embodiment. Particularly, even if just the developing process which is natural for forming the DFSR is carried out, the DFSR can have micro unevenness on the surface and thus it is possible to prepare the DFSR having superior adhesive strength with the follow-up materials through a simplified process.

As the polyimide-based resin, an arbitrary polyimide resin, a precursor of the same having a form of polyamic acid, or a derivative, showing non-reactivity and immiscibility to the acid-modified oligomer and solubility in the developer, may be used. For example, as the polyimide-based resin, a precursor of polyamic acid or a polyimide resin obtained by the reaction of a diamine having aliphatic or aromatic functional group and dianhydride may be used. Furthermore, considering above characteristics of the polyimide-based resin, the polyimide-based resin may have the weight average molecular weight of about 10,000 to 100,000, or the weight average molecular weight of about 20,000 to 100,000. It goes without saying that a polyimide-based resin personally synthesized according to the method obviously known to a person skilled in the art or a commercialized polyimide-based resin purchased can be used.

And, the content of the polyimide-based resin may be about 1 to 30 weight %, or about 5 to 27 weight %, or about 10 to 25 weight %, based on the total weight of the resin composition. If the content of the polyimide-based resin is too low, the micro unevenness is badly formed on the DFSR formed finally and the sufficient adhesive strength with the follow-up materials may not be secured, and if the content is excessively high, too much polyimide-based resin is eliminated from the light exposed part where the DFSR will be formed and the DFSR having a desired pattern may not be formed.

Photoinitiator

The resin composition of one embodiment includes a photoinitiator. Such photoinitiator, for example, plays a role of initiating a radical photo-curing at the light exposed part of the resin composition.

As the photoinitiator, any known initiators can be used, and a benzoin-based compound consisting of benzoin and an alkylester thereof, such as benzoin, benzoinmethylether, benzoinethylether, and the like; an acetophenone-based compound such as acetophenone, 2,2-dimethoxy-2-phenylacetophenone, 1,1-dichloroacetophenone, 4-(1-t-butyldioxy-1-methylethyl)acetophenone, and the like; an anthraquinone-based compound such as 2-methylanthraquinone, 2-amylanthraquinone, 2-t-butylanthraquinone, 1-chloroanthraquinone, and the like; a thioxanthone compound such as 2,4-dimethylthioxanthone, 2,4-diisopropylthioxanthone, 2-chlorothioxanthone, and the like; a ketal compound such as acetophenonedimethylketal, benzyldimethylketal, and the like; a benzophenone-based compound such as benzophenone, 4-(1-t-butyldioxy-1-methylethyl)benzophenone, 3,3', 4,4'-tetrakis(t-butyldioxycarbonyl) benzophenone, and the like may be used.

Furthermore, an α-aminoacetophenone compound such as 2-methyl-1-[4-(methylthio)phenyl]-2-morpholinopropanone-1,2-benzyl-2-dimethylamino-1-(4-morpholinophenyl)-butane-1-on, 2-(dimethylamino)-2-[(4-methylphenyl)methyl]-1-[4-(4-morpholinyl)phenyl]-1-butanone, N,N-dimethylaminoacetophenone (as an article on the market, Irgacure (registered trade mark) 907, Irgacure 369, Irgacure 379 and so on) of Chiba Specialty Chemicals Co., Ltd. (present Chiba Japan Co., Ltd.); and an acylphosphineoxide compound such as 2,4,6-trimethylbenzoyldiphenylphosphineoxide, bis(2,4,6-trimethylbenzoyl)-phenylphosphineoxide, bis(2,6-dimethoxybenzoyl)-2,4,4-trimethyl-pentylphosphineoxide (as an article on the market, Lucirin (registered trade mark) TPO of BASF Co., Ltd., Irgacure 819 of Chiba Specialty Chemicals Co., Ltd. may be mentioned as a preferable photoinitiator.

And, as other preferable photoinitiator, an oximeester compound may be used. As specific examples of the oximeester compound, 2-(acetyloxyiminomethyl)thioxanthene-9-on, (1,2-octanedion, 1-[4-(phenylthio)phenyl]-,2-(O-benzoyloxime)), (ethanone,1-[9-ethyl-6-(2-methylbenzoyl)-9H-carbazole-3-yl]-,1-(O-acetyloxime)), and the like may be used. As an article on the market, GGI-325, Irgacure OXE01, and Irgacure OXE02 of Chiba Specialty Chemicals Co., Ltd., N-1919 of ADEKA Co., Ltd., and Darocur TPO of Chiba Specialty Chemicals Co., Ltd. may be used. In addition, a biimidazole-based compound or a triazine-based compound may be used as a preferable photoinitiator.

The content of the photoinitiator may be about 0.5 to 20 weight %, or about 1 to 10 weight %, or about 1 to 5 weight %, based on the total weight of the resin composition. If the content of the photoinitiator is too low, the photo-curing may not occur properly, on the contrary, if the content is too high, the resolution of the resin composition may fall or the reliability of the DFSR may be insufficient.

Thermo-Curable Binder

The resin composition of one embodiment also includes a thermo-curable binder having thermo-curable functional group, for example, one or more group selected from epoxy group, oxetanyl group, cyclic ether group, and cyclic thioether group. Such thermo-curable binder forms a cross-linked bond with the acid-modified oligomer by the thermo-curing and can secure the heat resistance or the mechanical property of the DFSR.

The softening point of the thermo-curable binder may be about 70 to 100° C., and with this, the unevenness can be lessened during lamination. When the softening point is low, tackiness of the DFSR increases, and when it is high, flowability may deteriorate.

As the thermo-curable binder, a resin having two or more cyclic ether groups and/or cyclic thioether groups (hereinafter, cyclic (thio)ether groups) in the molecule may be used, and a bifunctional epoxy resin may be used. Other diisocyanate or bifunctional block isocyanate thereof may also be used.

The thermo-curable binder having two or more cyclic (thio)ether groups in the molecule may be a compound having two or more functional groups which are any one or two kinds of 3-membered, 4-membered, or 5-membered cyclic ether group or cyclic thioether group. Furthermore, the thermo-curable binder may be a multifunctional epoxy compound having at least two or more epoxy groups in the molecule, a multifunctional oxetane compound having at least two or more oxetanyl groups in the molecule, or an episulfide resin having at least two or more thioether groups in the molecule.

As examples of the multifunctional epoxy compound, bisphenol A-type epoxy resin, hydrogenated bisphenol A-type epoxy resin, brominated bisphenol A-type epoxy resin, bisphenol F-type epoxy resin, bisphenol S-type epoxy resin, novolak-type epoxy resin, phenol novolak-type epoxy resin, cresol novolak-type epoxy resin, N-glycidyl-type epoxy resin, novolak-type epoxy resin of bisphenol A, bixylenol-type epoxy resin, biphenol-type epoxy resin, chelate-type epoxy resin, glyoxal-type epoxy resin, amino group-containing epoxy resin, rubber-modified epoxy resin, dicyclopentadiene phenolic-type epoxy resin, diglycidylphthalate resin, heterocyclic epoxy resin, tetraglycidylxylenoylethane resin, silicon-modified epoxy resin, $\epsilon$-caprolactone-modified epoxy resin, and the like may be used. Furthermore, a compound of which phosphorus atom and the like is introduced in the structure may be used for giving flame retardance. These epoxy resins improve the adhesion property, the solder resistance, and the electroless plating resistance of the cured film through the thermo-curing process.

As the multifunctional oxetane compound, an esterified product of oxetane alcohol and a resin having hydroxyl group such as novolak resin, poly(p-hydroxystyrene), cardotype bisphenols, calix arenes, calix resorcinarenes, silsesquioxane, and the like may be used, in addition to the multifunctional oxetanes such as bis[(3-methyl-3-oxetanylmethoxy)methyl]ether, bis[(3-ethyl-3-oxetanylmethoxy)methyl]ether, 1,4-bis[(3-methyl-3-oxetanylmethoxy)methyl]benzene, 1,4-bis[(3-ethyl-3-oxetanylmethoxy)methyl]benzene, (3-methyl-3-oxetanyl)methylacrylate, (3-ethyl-3-oxetanyl)methylacrylate, (3-methyl-3-oxetanyl)methylmethacrylate, (3-ethyl-3-oxetanyl)methylmethacrylate, and an oligomer or copolymer thereof. In addition, a copolymer of an unsaturated monomer having oxetane ring and an alkyl(meth)acrylate may be used.

As the compound having two or more cyclic thioether groups in the molecule, for example, may be a bisphenol A-type episulfide resin (YL700) produced by Japan Epoxy Resin Co., Ltd. Furthermore, an episulfide resin that the oxygen atom of epoxy group of novolak epoxy resin is substituted with sulfur atom may be used.

Furthermore, as an article on the market, YDCN-500-80P and the like of Kukdo Chemical Co., Ltd. may be used.

The thermo-curable binder may be included in the amount corresponding to 0.8 to 2.0 equivalents per 1 equivalent of the carboxyl group of the acid-modified oligomer. If the content of the thermo-curable binder is too low, carboxyl groups remain in DFSR after curing and the heat resistance, the alkali resistance, and the electric insulation, and the like may deteriorate. On the contrary, if the content is too high, it is not preferable because low molecular weight thermo-curable binder remains in the dried film and the strength of the film decreases.

In addition to the components disclosed above, the resin composition of one embodiment may further include a solvent; and at least one component selected from the group consisting of a thermo-curable binder catalyst (thermo-curing catalyst) after-mentioned, a filler, a pigment, and an additive.

Thermo-Curable Binder Catalyst (Thermo-Curing Catalyst)

The thermo-curable binder catalyst plays a role of promoting the thermo-curing of the thermo-curable binder.

As the thermo-curable binder catalyst, for example, an imidazole derivative such as imidazole, 2-methyl imidazole, 2-ethyl imidazole, 2-ethyl-4-methyl imidazole, 2-phenyl imidazole, 4-phenyl imidazole, 1-cyanoethyl-2-phenyl imidazole, 1-(2-cyanoethyl)-2-ethyl-4-methyl imidazole, and the like; an amine compound such as dicyandiamide, benzyldimethyl amine, 4-(dimethylamino)-N,N-dimethylbenzyl amine, 4-methoxy-N,N-dimethylbenzyl amine, 4-methyl-N,N-dimethylbenzyl amine, and the like; a hydrazine compound such as adipic acid dihydrazide, sebacic acid dihydrazide, and the like; and a phosphorous compound such as triphenyl phosphine and the like may be used. And, as an article on the market, for example, 2MZ-A, 2MZ-OK, 2PHZ, 2P4BHZ, and 2P4MHZ (all of them are product names of imidazole-based compound) produced by Shikoku Kasei Kogyo Co., Ltd., U-CAT3503N and UCAT3502T (product names of block isocyanate compounds of dimethylamine), and DBU, DBN, U-CATSA102, and U-CAT5002 (product names of bicyclic amidine compounds and their salt) produced by San Apro Co., Ltd. Particularly, not limited to these, a thermo-curing catalyst for epoxy resin or oxetane compound, or a catalyst for promoting the reaction of epoxy resin and/or oxetane compound and carboxyl group, and it may be used solely or by mixed two or more of them. Furthermore, guanamine, acetoguanamine, benzoguanamine, melamine, and a S-triazine derivative such as 2,4-diamino-6-methacryloyloxyethyl-S-triazine, 2-vinyl-4,6-diamino-S-triazine, 2-vinyl-4,6-diamino-S-triazine•isocyanuric acid adduct, 2,4-diamino-6-methacryloyloxyethyl-S-triazine•isocyanuric acid adduct, and the like may be use, and preferably a compound functioning as an adhesion promoter may be used in company with the thermo-curable binder catalyst.

The content of the thermo-curable binder catalyst may be about 0.3 to 15 weight % based on the total weight of the resin composition, in the aspect of proper thermo-curing property.

Filler

The filler takes a role of improving the heat-resistant stability, the dimensional stability to heat, and the adhesive strength of the resin, and acts as a body pigment by reinforcing the color.

As the filler, inorganic or organic fillers may be used, for example barium sulfate, barium titanate, amorphous silica, crystalline silica, fused silica, spherical silica, talc, clay, magnesium carbonate, calcium carbonate, aluminum oxide (alumina), aluminum hydroxide, mica, and the like may be used.

The content of the filler may be about 5 to 50 weight % based on the total weight of the resin composition. When the filler is used over about 50 weight %, it is not preferable because the viscosity of the composition becomes high and the coatability may deteriorate or the curing degree falls down.

Pigment

The pigment takes a role of hiding the defects such as scratches of the circuit lines by providing visibility and hiding power.

As the pigment, red, blue, green, yellow, and black pigments may be used. As the blue pigment, phthalocyanine blue, pigment blue 15:1, pigment blue 15:2, pigment blue 15:3, pigment blue 15:4, pigment blue 15:6, pigment blue 60, and the like may be used. As the green pigment, pigment green 7, pigment green 36, solvent green 3, solvent green 5, solvent green 20, solvent green 28, and the like may be used. As the yellow pigment, anthraquinone-based compounds, isoindolinone-based compounds, condensed azo-based compounds, benzimidazolone-based compounds, and the like may be used, for example, pigment yellow 108, pigment yellow 147, pigment yellow 151, pigment yellow 166, pigment yellow 181, pigment yellow 193, and the like may be used.

The content of the pigment may be about 0.5 to 3 weight % based on the total weight of the photo-sensitive resin composition. When the pigment is used below about 0.5 weight %, the visibility and hiding power fall down, and when the pigment is used over about 3 weight %, the heat-resistant falls down.

Additive

The additive may be included therein for eliminating bubbles in the resin composition, eliminating popping or craters on the surface of the film during coating process, giving fire retardant property, controlling viscosity, or taking a role of catalyst.

Specifically, a well-known additive like a well-known thickener such as micronized silica, organic bentonite, montmorillonite, and the like; a silicon-based, fluoro-based, or polymer-based antifoaming agent and/or leveling agent; a imidazole-based, thiazole-based, or triazole-based silane coupling agent; a flame retardant such as phosphorus-based flame retardant, antimony-based flame retardant, and the like may be included therein.

Among them, the leveling agent takes a role of eliminating popping or craters on the surface of the film during coating process, for example, BYK-380N, BYK-307, BYK-378, BYK-350, and the like produced by BYK-Chemie GmbH may be used.

The content of the additive is preferably about 0.01 to 10 weight % based on the total weight of the resin composition.

Solvent

One or more solvents may be used by mixing each other for dissolving the resin composition or for giving proper viscosity thereto.

As the solvent, ketones such as methylethylketone, cyclohexanone, and the like; aromatic hydrocarbons such as toluene, xylene, tetramethylbenzene, and the like; glycol ethers (cellosolves) such as ethyleneglycol monoethylether, ethyleneglycol monomethylether, ethyleneglycol monobutylether, diethyleneglycol monoethylether, diethyleneglycol monomethylether, diethyleneglycol monobutylether, propyleneglycol monomethylether, propyleneglycol monoethylether, dipropyleneglycol diethylether, triethyleneglycol monoethylether, and the like; acetic acid esters such as ethyl acetate, butyl acetate, ethyleneglycol monoethylether acetate, ethyleneglycol monoethylether acetate, diethyleneglycol monoethylether acetate, diethyleneglycol monobutylether acetate, propyleneglycol monomethylether acetate, dipropyleneglycol monomethylether acetate, and the like; alcohols such as ethanol, propanol, ethylene glycol, propylene glycol, carbitol, and the like; aliphatic hydrocarbons such as octane, decane, and the like; petroleum solvents such as petroleum ether, petroleum naphtha, hydrogenated petroleum naphtha, solvent naphtha, and the like; and amides such as dimethyl acetamide, dimethylform amide (DMF), and the like may be used. These solvents may be used solely or by mixing two or more.

The content of the solvent may be about 10 to 50 weight % based on the total weight of the photo-sensitive resin composition. When the content is lower than 10 weight %, the viscosity is too high and the coatability falls down, and when the content is higher than 50 weight %, the drying property becomes bad and the tackiness increases.

Dry Film Solder Resist

According to another embodiment of the invention, a DFSR formed by using the photo-curable and thermo-curable resin composition of one embodiment disclosed above is provided. The DFSR includes a cured product of the acid-modified oligomer having carboxyl group (—COOH) and photo-curable unsaturated functional group; the photo-polymerizable monomer having two or more photo-curable unsaturated functional groups; and the thermo-curable binder having thermo-curable functional group, and may have micro unevenness having the average roughness (Rz) of about 2 to 20 μm, or about 3 to 10 μm, or about 4 to 8 μm on its surface. In the DFSR, the micro unevenness may have the average roughness (Ra) of about 50 nm to 5 μm, or about 50 nm to 5 μm, or about 100 nm to 3 μm, or about 200 nm to 2 μm.

At first, the forming process of DFSR is as follows.

After coating the resin composition of one embodiment as a photosensitive coating material on a carrier film with a comma coater, a blade coater, a lip coater, a road coater, a squeeze coater, a reverse coater, a transfer roll coater, a gravure coater, a spray coater, and the like and drying the same by passing through an oven of 50 to 130° C. for 1 to 30 minutes, a release film is laminated thereon so as to prepare a dry film consisting of a carrier film, a photosensitive film, and a release film sequentially from the bottom. The thickness of the photosensitive film may be about 5 to 100 μm. At this time, the carrier film may be a polyethylene terephthalate (PET) film, a polyester film, a polyimide film, a polyamideimide film, a polypropylene film, a polystyrene film, and the like, and the release film may be a polyethylene (PE) film, a polytetrafluoroethylene film, a polypropylene film, a surface-treated paper, and the like. For peeling away the release film, it is preferable that the adhesion between the photosensitive film and the release film is weaker than the adhesion between the photosensitive film and the carrier film.

Subsequently, after peeling away the release film, the photosensitive film layer is laminated onto a substrate with a circuit formed thereon by using a vacuum laminator, a hot roll laminator, a vacuum press, and the like.

Subsequently, the substrate is exposed to light (UV and the like) having a certain wavelength range. The substrate may be selectively exposed to light by using a photomask, or may be directly patterned by using a direct laser exposer. The carrier film is peeled away after the exposure. The light intensity depends on the film thickness, but preferably is in a range of about 0 to 1000 mJ/cm$^2$. By carrying out the light exposure, for example, the acid-modified oligomer, the photo-polymerizable monomer, and so on can be photo-cured and form a cross-linked bond at the exposed part, and thus the exposed part can remain without being eliminated in succeeding developing process. On the contrary, the non-exposed part keeps carboxyl group as it is, and can be developed by alkali.

Subsequently, a development process is carried out by using an alkaline solution. As the alkaline solution, an aqueous solution of an alkaline compound such as potassium hydroxide, sodium hydroxide, sodium carbonate, potassium carbonate, sodium phosphate, sodium silicate, ammonia, and an amine compound. By the development process, the acid-modified oligomer and the photo-polymerizable monomer in the non-exposed part can be dissolved and eliminated.

However, since the resin composition of one embodiment includes the polyimide-based resin, when the development process is carried out, not only the resin composition of the non-exposed part but also the polyimide-based resin in the exposed part may be selectively eliminated. Therefore, as disclosed above, the micro unevenness can be formed on the exposed part of the finally prepared DFSR.

Figure 1:
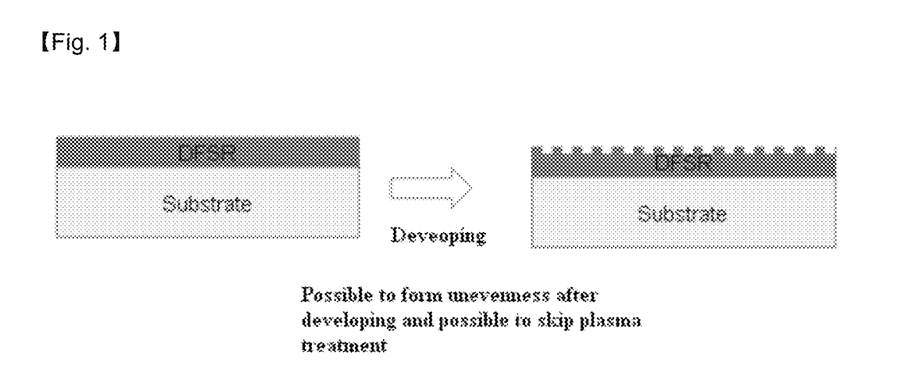
FIG. 1 is a schematic drawing showing the process of preparing the DFSR having micro unevenness by using the photo-curable and thermo-curable resin composition according to one embodiment of the invention.

As the result, a film having micro unevenness on the surface, as shown in FIG. 1, can be obtained through the development process.

Finally, the DFSR formed from the photosensitive film can be obtained by a heating and curing (post-cure) process. The heating and curing temperature is preferably 100° C. or more. By the heating and curing process, the thermo-curable functional group of the thermo-curable binder and the carboxyl group of the acid-modified oligomer can be cross-linked and form a cross-linked structure. And, as the result of the heating and curing process, micro unevenness formed by the polyimide-based resin after the development process is fixed on the surface. Therefore, the DFSR of which micro unevenness having the average roughness (Rz) of about 2 to 20 μm, about 3 to 10 μm, or about 4 to 8 μm, or the average roughness (Ra) of about 50 nm to 5 μm, about 50 nm to 5 μm, about 100 nm to 3 μm, or about 200 nm to 2 μm is formed on the surface can be obtained finally.

Through the method disclosed above, the DFSR and a printed circuit board including the same, for example, a package substrate of semiconductor can be provided, and since the DFSR has a certain micro unevenness on the surface, the contacting surface area between the DFSR and the follow-up materials increases and can show good adhesive strength. Furthermore, since the DFSR may include a cured product of the acid-modified oligomer; the photo-polymerizable monomer; and the thermo-curable binder having thermo-curable functional group, disclosed above, because the DFSR is formed by the photo-curing and the thermo-curing.

More specifically, in the cured product, the carboxyl group of the acid-modified oligomer can be cross-linked with the thermo-curable functional group of the thermo-curable binder by the thermo-curing process, and the photo-curable unsaturated functional group of the acid-modified oligomer can be cross-linked with the unsaturated functional group included in the photo-polymerizable monomer and form a cross-linked structure. Furthermore, as disclosed above, since the polyimide-based resin is eliminated during the DFSR forming process, said micro unevenness can be formed on the surface of the DFSR.

Like this, since it becomes possible to form the DFSR having micro unevenness on the surface without a separate plasma treatment and the like, it becomes possible to provide the DFSR having good adhesive strength with the follow-up materials when it is applied to the semiconductor package substrate, and it becomes possible to provide the DFSR showing and maintaining superior properties by suppressing the property decrease of the DFSR caused by the plasma treatment and the like.

In addition, the DFSR may further include a small quantity of photoinitiator left after the photo-curing dispersed in the cured product.

Effects of the Invention

According to the present invention, it is possible to provide a photo-curable and thermo-curable resin composition which can form a DFSR having micro unevenness on the surface without a separate treatment such as plasma treatment and the like and a DFSR. The DFSR formed like this can show good adhesive strength with the follow-up materials due to micro unevenness when it is applied to the semiconductor package substrate and it can be prepared by more simplified and economical process without a separate treatment such as plasma treatment and the like. And the DFSR can show superior properties and maintain the properties because the property decrease caused by the plasma treatment is suppressed.

DETAILED DESCRIPTION OF THE EMBODIMENT

Hereinafter, the functions and effects of the present invention are explained in more detail by referring to specific examples of the present invention. However, the following examples are only for the understanding of the present invention and the scope of the present invention is not limited to or by them.

EXAMPLES

Example 1

(1) Preparation of Polyimide-Based Resin

In order to synthesize a polyimide-based resin, after dissolving ODA (4,4-diaminodiphenyl ether) as a polymerizing monomer in DMF, a solvent, to be 20 weight %, PMDA (pyromellitic dianhydride) was added therto with the mole ratio of 1:1 to ODA, and then the mixture was stirred for 24 hours in an ice bath condition and the PAA (polyamic acid) of which the weight average molecular weight was 31,500 was obtained.

(2) Preparation of Dry Film Solder Resist

A photo-curable and thermo-curable resin composition was obtained by mixing and stirring 11.5 weight % of the PAA (polyamic acid) type polyimide-based resin prepared above, 30 weight % of ZFR-1122 of Nipponkayaku Co., Ltd. as an acid-modified oligomer, 10 weight % of a multifunctional epoxy acrylate (DPEA-12 of Nipponkayaku Co., Ltd.) as a photo-polymerizable monomer, 3 weight % of Darocur TPO (Chiba Specialty Chemicals Co., Ltd.) as a photoinitiator, 16 weight % of YDCN-500-80P (Kukdo Chemical Co., Ltd.) as a thermo-curable binder, 1 weight % of 2-phenylimidazole as a thermo-curing catalyst, 15 weight % of B-30 (Sakai Chemical Co., Ltd.) as a filler, 0.5 weight % of BYK-333 of BYK-Chemie GmbH as an additive, and 13 weight % of DMF as a solvent, followed by dispersing the filler with a 3 roll mill device.

A dry film composed of a carrier film, a photo-sensitive film, and a release film sequentially from the bottom was prepared by coating the prepared photo-sensitive resin composition on a carrier film (PET film), drying the same by passing through an oven of 75° C. for 8 minutes, and laminating a release film (PE film) thereon.

(3) Preparation of Printed Circuit Board

After peeling away the release film from the prepared dry film, the photo-sensitive film layer was vacuum-laminated with a vacuum laminator (MV LP-500 made by Meiki Seisakusho Co., Ltd.) on a board on which a circuit was formed, the film was exposed to the UV ray of 365 nm with 400 mJ/cm$^2$, and the PET film was eliminated. A printed circuit board including a dry film solder resist (DFSR) was prepared by dipping the result product in 1% $Na_2CO_3$ alkaline solution of 31° C. being stirred for development, and heating and curing the same at 150° C. for 1 hour.

Meanwhile, a copper clad laminate LG-T-500GA made by LG Chemical Co., Ltd. of which the thickness of the board was 0.1 mm and the thickness of copper foil was 12 μm was used as the board on which a circuit was formed. At this time, the board was cut into 5×5 cm squares and micro unevenness was formed with chemical etching on the surface of copper foil of the same.

Example 2

(1) Preparation of Polyimide-Based Resin

In order to synthesize a polyimide-based resin, after dissolving ODA (4,4-diaminodiphenyl ether) as a polymerizing monomer in DMF as a solvent to be 20 weight %, ODPA (4,4'-oxydiphthalic anhydride) was added therto with the mole ratio of 1:1 to ODA, and then the mixture was stirred for 24 hours in an ice bath condition and the PAA (polyamic acid) of which the weight average molecular weight was 33,000 was obtained.

(2) Preparation of Dry Film Solder Resist

A photo-curable and thermo-curable resin composition was obtained substantially according to the same method as in Example 1, except that the PAA (polyamic acid) type polyimide-based resin prepared above was used and 30 weight % of ZFR-1121 of Nipponkayaku Co., Ltd. was used as an acid-modified oligomer.

A dry film composed of a carrier film, a photo-sensitive film, and a release film sequentially from the bottom was prepared by coating the prepared photo-sensitive resin composition on a carrier film (PET film), drying the same by passing through an oven of 75° C. for 8 minutes, and laminating a release film (PE film) thereon.

(3) Preparation of Printed Circuit Board

A printed circuit board including a DFSR was obtained substantially according to the same method as in Example 1, except that the dry film prepared above was used.

Comparative Examples

Comparative Example 1

A printed circuit board including a DFSR was obtained substantially according to the same method as in Example 1, except that 41.5 weight % of ZFR-1122 was used as an acid-modified oligomer without using the polyimide-based resin of Example 1.

Experimental Examples

Property Evaluation of Protect Film for Printed Circuit Board

Surface roughness, developing property, and heat-resistant reliability of the dry film solder resists for printed circuit board prepared in Examples 1 and 2, and Comparative Example 2 were measured according to the following methods.

Experimental Example 1

Surface Roughness

Each DFSR obtained in Examples 1 and 2, and Comparative Example 2 was positioned on a copper clad laminate after peeling away the release films therefrom, and they were vacuum treated for 20 seconds and laminated with the temperature of 65° C. and the pressure of 0.7 Mpa for 40 seconds by using a vacuum laminator.

And, after positioning a negative type quartz photo mask on the laminated DFSR, exposing the same to the UV ray (i band) of 400 mJ/cm$^2$, and peeling away the PET carrier film therefrom, the laminate was developed in 1% $Na_2CO_3$ alkaline solution of 30° C., and then washed and dried.

Figure 2:
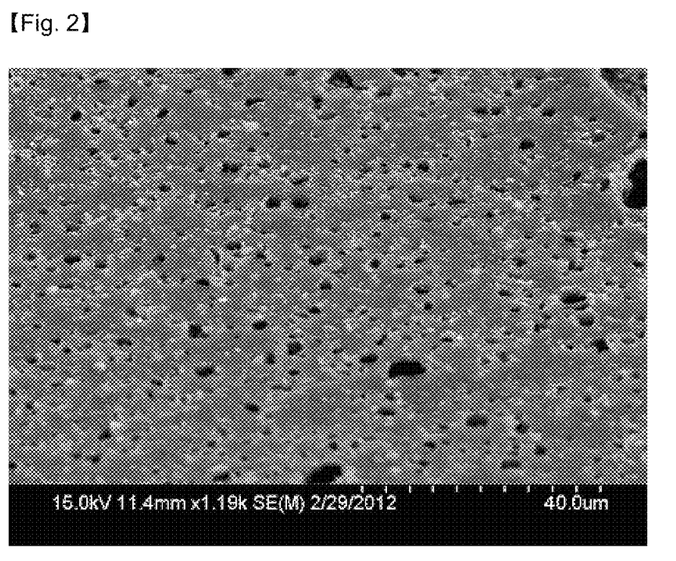
FIGS. 2 and 3 are FE-SEM photos showing the surface conditions of the DFSRs prepared in Examples 1 and 2.
Figure 3:
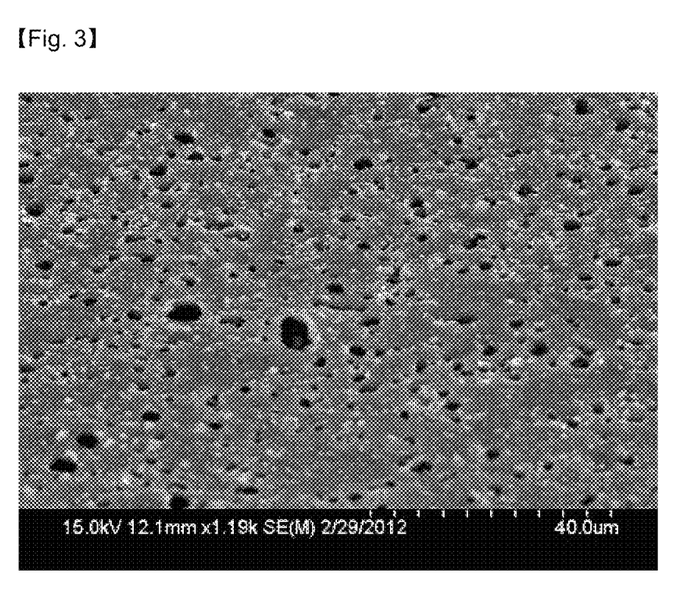
Figure 4:
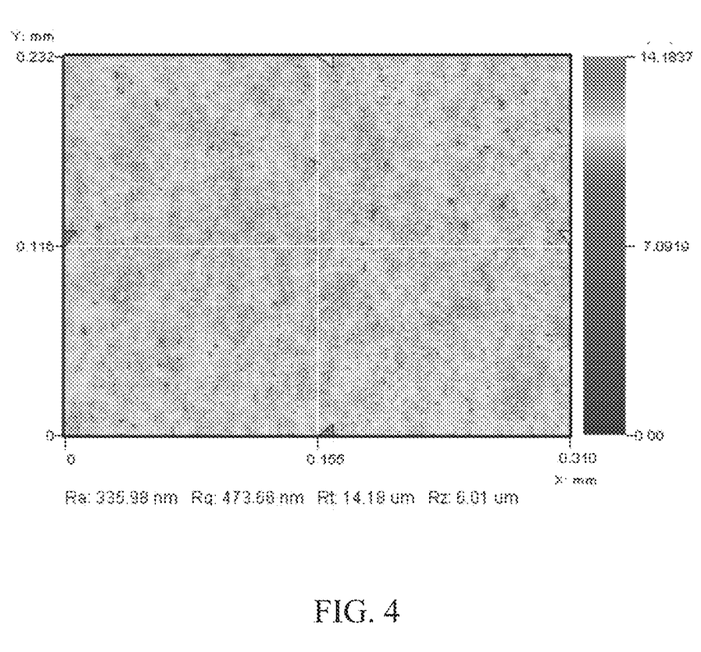
FIGS. 4, 5, and 6 are images of Examples 1, 2, and Comparative Example 1 obtained using OP.
Figure 5:
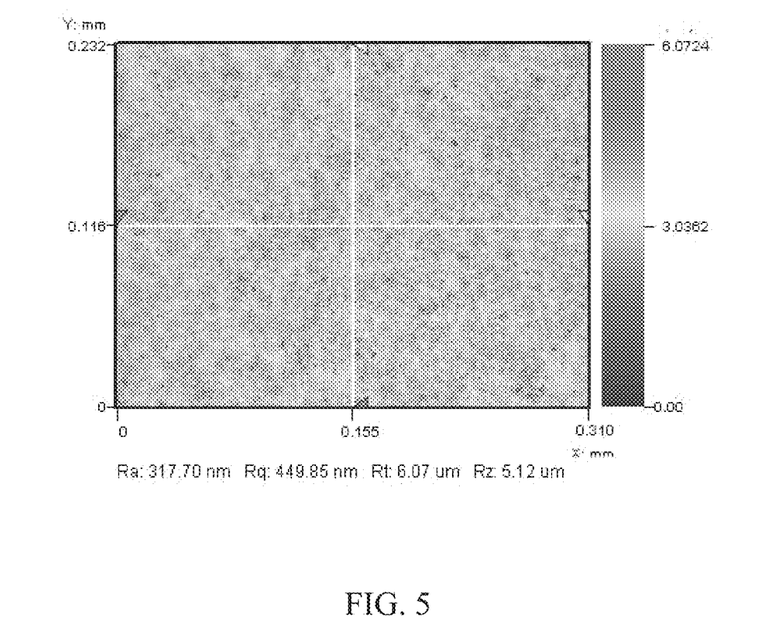
Figure 6:
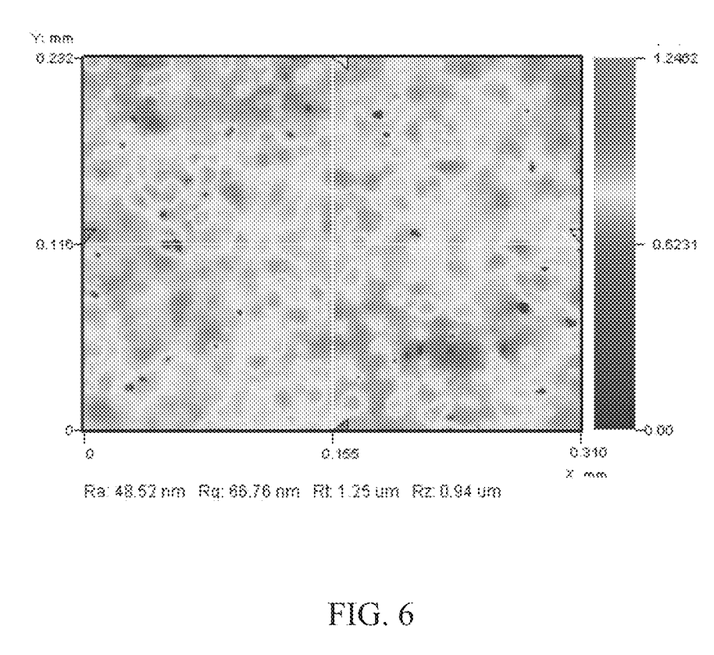

The surface condition of the dried sample was checked by FE-SEM (Hitachi S-4800), and the surface roughness values Rz and Ra of Example 1 and Comparative Example 1 were measured for comparing the difference of the surface roughness thereof by using an optical profiler (OP, nanoview of Nanosystem Co., Ltd.). The FE-SEM photos of the surface conditions of Examples 1 and 2 are annexed in FIGS. 2 and 3. The images of Examples 1 and 2 and Comparative Example 1 which were obtained by using the OP are annexed in FIGS. 4, 5, and 6, respectively. The Rz and Ra values of Examples 1 and 2 and Comparative Example 1 obtained by using the OP are listed in the following Table 1.

Experimental Example 2

Evaluation of Developing Property

Each DFSR obtained in Examples 1 and 2, and Comparative Example 2 was positioned on a copper clad laminate after peeling away the release films therefrom, and they were vacuum treated for 20 seconds, and laminated with the temperature of 65° C. and the pressure of 0.7 Mpa for 40 seconds by using a vacuum laminator.

And, after positioning a negative type quartz photo mask on the laminated DFSR, exposing the same to the UV ray (i band) of 400 mJ/cm$^2$, and peeling away the PET carrier film therefrom, the laminate was developed in 1% $Na_2CO_3$ alkaline solution of 30° C., and then washed and dried.

The evaluation standard and result of the developing property are listed in the following Table 2.

Experimental Example 3

Measuring Method of Heat-Resistant Reliability

The protect film for printed circuit board was laminated on a copper clad laminate (CCL) and a photo-curing, a thermo-curing, and a post photo-curing processes were carried out to the film. And then, the film was cut into 150 mm×130 mm. After setting the temperature of a lead bath (an electric furnace, which can be electrically heated and the temperature is controllable, including minimum 2.25 kg or more lead for test) to 288° C., the test specimen was floated on the lead bath, the film side up. It was examined whether the test specimen was exfoliated or deformed in external appearance.

The evaluation standard and result of the heat-resistant reliability are listed in the following Table 2.

TABLE 1

|  | Rz | Ra |
| --- | --- | --- |
| Example 1 | 6.01 μm | 335.98 μm |
| Example 2 | 5.12 μm | 317.70 μm |
| Comparative Example 1 | 0.94 μm | 48.52 μm |

Referring to Table 1, it was recognized that micro unevenness having the average roughness (Rz) of about 6.01 μm and the average roughness (Ra) of about 335.98 nm, and the average roughness (Rz) of about 5.12 μm and the average roughness (Ra) of about 317.70 nm was formed on the surface of each DFSR of Examples 1 and 2 because they were formed from the resin compositions including the polyimide-based resin.

On the contrary, it was recognized that the DFSR of Comparative Example 1 did not have such micro unevenness without a separate plasma treatment and just showed the average roughness (Rz) of about 0.94 μm and the average roughness (Ra) of about 48.52 nm.

TABLE 2

| Results of Experimental Examples 2 and 3 | | |
| --- | --- | --- |
|  | heat-resistant reliability | developing property |
| Example 1 | OK | OK |
| Example 2 | OK | OK |
| Comparative Example 1 | OK | OK |

1. Evaluation standard of heat-resistant reliability
(1) OK: 288° C., not bursting in the solder floating test
(2) NG: 288° C., bursting in the solder floating test
2. Developing property
Observing the Fe-SEM result, it is evaluated as OK when the hole formed by the mask size of 100 μm has the size of 90 μm or more.

Referring to Table 2, it was recognized that the DFSRs of Examples had micro unevenness on the surface but the heat-resistant reliability and the developing property of the DFSRs of Examples were as good as the DFSR of Comparative Example not having micro unevenness. Therefore, the DFSR of Example can show good adhesive strength and good property as the DFSR at the same time.

The invention claimed is:

1. A photo-curable and thermo-curable resin composition, including:
    an acid-modified oligomer having carboxyl group (—COOH) and photo-curable unsaturated functional group;
    a photo-polymerizable monomer having two or more photo-curable unsaturated functional groups;
    a polyamic acid having a weight average molecular weight of 10,000 to 100,000,, which has no photo-curable property, and is not miscible with the acid-modified oligomer and the photo-polymerizable monomer;
    a thermo-curable binder having thermo-curable functional group; and
    a photoinitiator,
    wherein the content of the polyamic acid is 1 to 30 weight % based on the total weight of the resin composition, and
    wherein a dry film solder resist formed from said resin composition has an average roughness (Rz) of 2 to 20 μm of microunevenness.

2. The resin composition according to claim 1, wherein the photo-curable unsaturated functional group of the acid-modified oligomer is an acrylate group.

3. The resin composition according to claim 1, wherein the acid-modified oligomer includes a copolymer of a polymerizable monomer having carboxyl group and a monomer including acrylate-based compound.

4. The resin composition according to claim 1, wherein the content of the acid-modified oligomer is 15 to 75 weight % based on the total weight of the resin composition.

5. The resin composition according to claim 1, wherein the acid value of the acid-modified oligomer is 40 to 120 mgKOH/g.

6. The resin composition according to claim 1, wherein the photo-polymerizable monomer includes a multifunctional (meth)acrylate-based compound having two or more (meth)acryloyl groups in the molecule.

7. The resin composition according to claim 1, wherein the photo-polymerizable monomer includes one or more multifunctional (meth)acrylate-based compounds selected from the group consisting of a multifunctional acrylate-based compound having hydroxyl group; a water-soluble multifunctional acrylate-based compound; a multifunctional polyesteracrylate-based compound of a polyhydric alcohol; an acrylate-based compound of an ethyleneoxide adduct of multifunctional alcohol or polyphenol; an acrylate-based compound of an propyleneoxide adduct of multifunctional alcohol or polyphenol; a multifunctional or monofunctional polyurethaneacrylate-based compound; an epoxyacrylate-based compound; a caprolactone-modified acrylate-based compound; and a photosensitive (meth)acrylate-based compound.

8. The resin composition according to claim 1, wherein the content of the photo-polymerizable monomer is 5 to 30 weight % based on the total weight of the resin composition.

9. The resin composition according to claim 1, wherein the photoinitiator includes one or more compounds selected from the group consisting of a benzoin-based compound, an acetophenone-based compound, an anthraquinone-based compound, a thioxanthone compound, a ketal compound, a benzophenone-based compound, an α-aminoacetophenone compound, an acylphosphineoxide compound, an oximeester compound, a biimidazole-based compound, and a triazine-based compound.

10. The resin composition according to claim 1, wherein the content of the photoinitiator is 0.5 to 20 weight % based on the total weight of the resin composition.

11. The resin composition according to claim 1, wherein the thermo-curable functional group is one or more group selected from the group consisting of an epoxy group, an oxetanyl group, a cyclic ether group, and a cyclic thioether group.

12. The resin composition according to claim 1, wherein the content of the thermo-curable binder corresponds to 0.8 to 2.0 equivalents per 1 equivalent of the carboxyl group of the acid-modified oligomer.

13. The resin composition according to claim 1, further including a solvent; and at least one component selected from the group consisting of a thermo-curable binder catalyst, a filler, a pigment, and an additive.

14. A dry film solder resist including a cured product of the resin composition according to claim 1, wherein the cured product includes:
- a cross-linked structure in which the carboxyl group of the acid-modified oligomer and the thermo-curable functional group are cross-linked; and
- a cross-linked structure in which the unsaturated functional groups of the acid-modified oligomer and the photo-polymerizable monomer are cross-linked each other.

15. A dry film solder resist including a cured product of the resin composition according to claim 1, further including a photoinitiator dispersed in the cured product.

16. A dry film solder resist including a cured product of the resin composition according to claim 1, which is for the preparation of a package substrate of a semiconductor device.

* * * * *